(12) United States Patent
Suzuki et al.

(10) Patent No.: US 8,563,112 B2
(45) Date of Patent: Oct. 22, 2013

(54) ORGANIC EL LIGHT-EMITTING DEVICE AND METHOD FOR MANUFACTURING THE ORGANIC EL LIGHT-EMITTING DEVICE

(75) Inventors: Joji Suzuki, Yamagata (JP); Fujio Kajikawa, Yamagata (JP); Yasuki Kawashima, Koka (JP); Shigeyuki Nakai, Osaka (JP)

(73) Assignees: Yamagata Promotional Organization for Industrial Technology, Yamagata-shi, Yamagata (JP); NEC Lighting, Ltd., Tokyo (JP)

( * ) Notice: Subject to any disclaimer, the term of this patent is extended or adjusted under 35 U.S.C. 154(b) by 50 days.

(21) Appl. No.: 12/990,901

(22) PCT Filed: Apr. 28, 2009

(86) PCT No.: PCT/JP2009/058340
§ 371 (c)(1),
(2), (4) Date: Nov. 3, 2010

(87) PCT Pub. No.: WO2009/139292
PCT Pub. Date: Nov. 19, 2009

(65) Prior Publication Data
US 2011/0052857 A1    Mar. 3, 2011

(30) Foreign Application Priority Data
May 12, 2008  (JP) ................. 2008-124330

(51) Int. Cl.
*B32B 3/02*   (2006.01)
*B32B 37/12*  (2006.01)

(52) U.S. Cl.
USPC ........................................................... 428/76

(58) Field of Classification Search
USPC ............................................ 428/76; 156/295
See application file for complete search history.

(56) References Cited

U.S. PATENT DOCUMENTS 5,276,414 A * 1/1994 Fujimoto et al. ............ 333/246
5,398,051 A * 3/1995 Fukui et al. ................. 347/213
(Continued)

FOREIGN PATENT DOCUMENTS

JP   9-204981 A    8/1997
JP   9-330788 A   12/1997
(Continued)

OTHER PUBLICATIONS

Machine_English_Translation_JP_2008085172_A; Kawakami; Light Emitting Device; Apr. 10, 2008; JPO & Derwent; whole document.*

(Continued)

*Primary Examiner* — David Sample
*Assistant Examiner* — Tahseen N Khan
(74) *Attorney, Agent, or Firm* — Westerman, Hattori, Daniels & Adrian, LLP

(57) ABSTRACT

This invention provides an organic EL light-emitting device, which can prevent the occurrence of brightness unevenness due to resistance of a transparent electrode, in a large surface light-emitting panel of an organic EL element.
The organic EL light-emitting device includes an element formation substrate 1, on which an organic EL element 2 including an organic light-emitting layer is stacked, and a sealing substrate 3 for sealing the organic EL element so as to accommodate the organic EL element between the element formation substrate and the sealing substrate. A sealing portion 4 formed of an adhesive is formed in the peripheral edge portion between the element formation substrate 1 and the sealing substrate 3, and a grease layer 5 or a gel layer 5 is accommodated in between the element formation substrate, on which the organic EL element surrounded by the sealing portion is formed, and the plate-shaped sealing substrate so as to adhere to the element formation substrate and the sealing substrate. The grease layer 5 or the gel layer 5 contains an oligomer or a polymer having organosiloxane bond ($-R_2SiO-$) or fluorinated polyether ($-CF_2CFYO-$) as a skeleton.

11 Claims, 8 Drawing Sheets

(56) References Cited

U.S. PATENT DOCUMENTS

| | | | |
|---|---|---|---|
| 6,519,407 B1* | 2/2003 | Kawase et al. | 385/147 |
| 6,759,660 B2 | 7/2004 | Izumi et al. | |
| 6,839,475 B2* | 1/2005 | Kawase et al. | 385/14 |
| 2001/0053648 A1 | 12/2001 | Furukawa et al. | |
| 2002/0168793 A1 | 11/2002 | Izumi et al. | |
| 2004/0211910 A1 | 10/2004 | Izumi et al. | |
| 2005/0140291 A1 | 6/2005 | Hirakata et al. | |

FOREIGN PATENT DOCUMENTS

| | | | |
|---|---|---|---|
| JP | 10-074583 A | | 3/1998 |
| JP | 2000-357587 A | | 12/2000 |
| JP | 2001-068266 A | | 3/2001 |
| JP | 2001-217071 A | | 8/2001 |
| JP | 2001-282120 A | | 10/2001 |
| JP | 2002-333848 A | | 11/2002 |
| JP | 2003-007450 A | | 1/2003 |
| JP | 2003-173868 A | | 6/2003 |
| JP | 2005-209631 A | | 8/2005 |
| JP | 2006-179218 A | | 7/2006 |
| JP | 2006179218 A | * | 7/2006 |
| JP | 2008-077943 A | | 4/2008 |
| JP | 2008-085172 A | | 4/2008 |
| JP | 2008085172 A | * | 4/2008 |

OTHER PUBLICATIONS

Machine_English_Translation_JP_2006179218_A; Yoshihara; Organic EL Panel and Organic EL Light Emitting Device, As well as Manufacturing Method of Organic EL Panel; Jul. 6, 2006; JPO & Derwent; whole document.*

International Search Report of PCT/JP2009/058340, mailing date Jun. 16, 2009.

* cited by examiner

[E]

[F]

[G]

| NAME OF THIN-FILM LAYER | MATERIAL |
|---|---|
| NEGATIVE ELECTRODE | Al |
| ELECTRON TRANSPORTATION LAYER | ETL |
| LIGHT-EMITTING LAYER | EML |
| HOLE TRANSPORTATION LAYER | HTL |
| CHARGE GENERATING LAYER | CGL |
| ELECTRON TRANSPORTATION LAYER | ETL |
| LIGHT-EMITTING LAYER | EML |
| HOLE TRANSPORTATION LAYER | HTL |
| POSITIVE ELECTRODE | ITO |

FIG. 6

| FILLER | NAME OF PRODUCT | TEMPERATURE MEASURED POINT [°C] ELAPSED TIME: 30 MIN. | | | | | | | | | AVERAGE VALUE | Max-Min | COMMENT |
|---|---|---|---|---|---|---|---|---|---|---|---|---|---|
| | | A | B | C | D | E | F | G | H | I | | | |
| NITROGEN | | — | — | — | — | — | — | — | — | — | — | — | SHORT OCCURS DUE TO TEMPERATURE INCREASE NEAR TERMINAL AND MEASUREMENT CANNOT BE PERFORMED |
| LIQUID | SH550 | 63.4 | 58.8 | 63.7 | 63.9 | 57.2 | 63.6 | 63.5 | 57.1 | 63.3 | 61.6 | 6.8 | |
| GEL/GREASE | KE1057 +CaO(30wt%) +Al2O3(30wt%) | 53.1 | 52.8 | 53.1 | 53.2 | 52.6 | 52.9 | 53.0 | 52.3 | 53.0 | 52.9 | 0.9 | |

ORGANIC EL LIGHT-EMITTING DEVICE AND METHOD FOR MANUFACTURING THE ORGANIC EL LIGHT-EMITTING DEVICE

FIELD OF THE INVENTION

This invention relates to an organic EL (electroluminescence) light-emitting device using an organic EL element as a light-emitting source and a method for manufacturing the organic EL light-emitting device.

DESCRIPTION OF THE RELATED ART

An organic EL element is driven by a DC power supply with a low voltage to thereby provide a high light-emitting efficiency, and can be reduced in weight and thickness, whereby the organic EL element is used in a flat panel display (FPD) in some portable apparatuses. In addition, there is provided one in which the organic EL element as a surface light-emitting source is used as, for example, a backlight for a liquid crystal display element.

Meanwhile, the organic EL element can provide various light emission colors depending on the selection of a material used for a light-emitting layer. Accordingly, one or a combination of two or more kinds of the light emission colors can provide an arbitrary light emission color. Therefore, the organic EL element is constituted as a surface light-emitting source (light-emitting panel) having a relatively large area, whereby the organic EL element can be used for, for example, a light-emitting poster for advertisement and an illumination light source, and in addition, used as a high efficiency light source for illuminating a room, a car interior, or the like.

In the organic EL element, a direct current voltage is applied between opposed electrodes, whereby an electron injected from a negative electrode and a hole injected from a positive electrode are recombined with each other in the light-emitting layer, and a fluorescent material is excited by the energy level of the recombination to generate light. Therefore, the light emitted from the light-emitting layer is required to be taken out to the outside, and thus, a transparent electrode is used for at least one electrode. As the transparent electrode, indium tin oxide (ITO) or the like is normally used.

The ITO constituting the transparent electrode has electrical resistivity of about $1\times10^{-4}$ Ωcm, which is one or two figures higher than that of normal metal materials. Thus, direct current for driving the organic EL element to emit light flows into the transparent electrode, whereby the transparent electrode generates heat by the electric resistance.

The organic EL element has a characteristic that it emits light when a voltage equal to or larger than a light emission threshold voltage inherent in the element is applied thereto in a forward direction. As a value of the current applied thereto increases, the light emission brightness of the organic EL element increases.

Meanwhile, as described above, the resistance value of the transparent electrode such as ITO constituting the organic EL element is high, and the current more easily flows near a power-feeding part of an organic EL light-emitting panel than a portion distant from the power-feeding part. Thus, even when the entire light-emitting panel is driven by constant current, the electric current value near the power-feeding part is higher than that in the portion distant from the power-feeding part, whereby the portion near the power-feeding part is more brightly illuminated, leading to the occurrence of unevenness of the light emission brightness. In addition, the current not contributive to the light emission of the organic EL light-emitting element is converted to heat, and therefore, in a bright portion, that is, a portion to which a large amount of current is applied, the absolute amount of the current not contributive to the light emission of the organic EL light-emitting element is large, and the amount of heat generation is larger than that of a dark portion.

The temperature of the organic EL element is increased by the heat generation to facilitate the flow of current, and the current is applied, in a runaway manner, to a region with relatively high current and voltage for brighter light emitting purposes, leading to the possibility of destruction of the organic EL element.

As described above, there occurs a problem that the unevenness of the light emission brightness of the EL element occurs due to the influence of the heat generation of the transparent electrode constituting the organic EL element and the influence of the heat generation caused by the characteristics of the organic EL element. When a surface light-emitting source having a relatively large area is formed of the organic EL element, there occurs such a brightness gradient (brightness unevenness) that the central portion of the surface light-emitting source is generally dark, and the portion near the power-feeding part provided around the central portion is bright.

The organic EL light-emitting device of this invention attempts to prevent the occurrence of the brightness unevenness accompanying the heat generation of the organic EL element. Although the problem to be solved is different from this invention, following patent documents 1-3 disclose an organic EL light-emitting device having a basic structure substantially the same as the organic EL light-emitting device of this invention, which will be described in detail later.

[Patent Document 1] Japanese Patent Application Laid-Open No. 2000-357587

[Patent Document 2] Japanese Patent Application Laid-Open No. 2001-217071

[Patent Document 3] Japanese Patent Application Laid-Open No. 2003-173868

FIG. 12 is a schematic view (cross-sectional view) of an example of the organic EL light-emitting device disclosed in the patent document 1. The four sides of the opening of the sealing member 13 with a recessed cross-sectional surface are attached to the element formation substrate 12, on which the organic EL element 11 is formed, through the adhesive 14. The drying agent 15 is disposed on the inner surface of the sealing member 13, and an inert gas is filled and sealed in the space 16 formed between the element formation substrate 12 and the sealing member 13.

In the organic EL light-emitting device disclosed in the patent document 2, the sealing member with a recessed cross-sectional surface is attached onto the element formation substrate on which the organic EL element is formed, and the drying agent consisting of inert liquid is injected into the space between the element formation substrate and the sealing member. In the description of the document, the drying agent consisting of inert liquid protects the organic EL element and prevents the deterioration of a thin-film material in an organic layer.

In the organic EL light-emitting device disclosed in the patent document 3, the element formation substrate on which the organic EL element is formed is covered by a cap glass. A sealing liquid such as silicon oil is filled and sealed in the space in which the organic EL element covered by the cap glass is disposed, and the peripheral edge between the element formation substrate and the cap glass is sealed by a sealing agent. In the description of this organic EL light-emitting device disclosed in the patent document 1, the organic EL element can be moisture proofed by the sealing liquid.

DISCLOSURE OF THE INVENTION

Problems to be Solved by the Invention

In addition to the organic EL light-emitting devices disclosed in the patent documents 1 to 3, there are many patent documents disclosing such a constitution that the organic EL element formed on the element formation substrate is sealed; however, most of these documents focus on the moisture-proof of the organic EL element and the prevention of the generation of a so-called dark spot (a minute non-light-emitting portion in a light-emitting area) in the organic EL element.

An object of this invention is to provide an organic EL light-emitting device, which can, as described above, protect an organic EL element from moisture, can efficiently transfer heat generated from the organic EL element to a sealing substrate, can dissipate heat to the outside of a panel, and can, as described above, effectively prevent the occurrence of brightness unevenness by effectively dissipating heat generated from the organic EL element, and a method for manufacturing the organic EL light-emitting device.

Means for Solving the Problems

In order to achieve the above object, the organic EL light-emitting device of the present invention includes an element formation substrate, on which a light-emitting part of an organic EL element including an organic light-emitting layer is formed, and a sealing substrate for sealing the organic EL element so as to accommodate the organic EL element between the sealing substrate and the element formation substrate. The organic EL light-emitting device is characterized in that an adhesive sealing portion is formed in the peripheral edge portion between the sealing substrate and the element formation substrate, and a grease layer or a gel layer is accommodated in between the element formation substrate, on which the organic EL element surrounded by the sealing portion is formed, and the sealing substrate in such a state of adhering to the element formation substrate and the sealing substrate.

In the above case, it is preferable that the grease layer or the gel layer contains an oligomer or a polymer containing organosiloxane (—$R_1R_2SiO$—: $R_1$ and $R_2$ represent a saturated or unsaturated alkyl group, a substituted or unsubstituted phenyl group, or a saturated or unsaturated fluoroalkyl group.) or fluorinated polyether (—$CF_2CFYO$—: Y represents F or $CF_3$.) in the skeleton.

As the sealing substrate, there is used a substrate having a plate shape or a substrate with a recessed cross-sectional surface, in which a recess is provided in the central portion so that the peripheral edge portion is in contact with the element formation substrate side. The adhesive sealing portion in the peripheral edge portion preferably adopts sealing with an adhesive or sealing means by thermal fusion.

As the organosiloxane contained in the grease layer or the gel layer, there is preferably used an oligomer or a polymer containing —$(R_1R_1SiO)_l$—$(R_1R_2SiO)_m$—$(R_1R_3SiO)_n$— ($R_1$ represents a methyl group, $R_2$ represents a vinyl group or a phenyl group, $R_3$ represents a fluoroalkyl group of —$CH_2CH_2CF_3$, and l, m, and n represent integer numbers, and one or two of three figures may be 0.) in the skeleton.

Further, as the fluorinated polyether contained in the grease layer or the gel layer, there is preferably used an oligomer or a polymer containing —$CF_2CFYO$— (Y represents F or $CF_3$) in the skeleton and having a functional group containing Si at the terminal.

It is preferable that the grease layer or the gel layer contains, as an additive, a moisture absorbent or a heat-transfer agent, or the moisture absorbent and the heat-transfer agent. In this case, it is preferable that a mixture, which is used as the moisture absorbent and constituted of one or a plurality of kinds of a chemical moisture absorbent or a physical moisture absorbent, is dispersed in the grease layer or the gel layer.

As the chemical moisture absorbent, a mixture constituted of one or a plurality of kinds selected from calcium oxide, barium oxide, and strontium oxide can be used. As the physical moisture absorbent, a mixture constituted of one or both of synthetic zeolite and silica gel can be used.

As the heat-transfer agent, it is preferable that a mixture constituted of one or a plurality of kinds of a metal oxide, a nitride, or synthetic zeolite and silica gel is dispersed in the grease layer or the gel layer.

In the above case, as the metal oxide, a mixture constituted of one or a plurality of kinds selected from silicon oxide, aluminum oxide, calcium oxide, barium oxide, and strontium oxide can be used. As the nitride, a mixture constituted of one or both of silicon nitride and aluminum nitride can be used.

In a preferred embodiment, when the plate-shaped sealing substrate is used, the additive is contained in the grease layer or the gel layer in a weight ratio of 10 to 80%, and the thickness of the grease layer or the gel layer containing the additive is set in a range of is 10 to 100 μm.

Meanwhile, when the sealing substrate with a recessed cross-sectional surface is used, the additive is contained in the grease layer or the gel layer in a weight ratio of 10 to 80%.

Meanwhile, there can be preferably used such a constitution that the sealing substrate further includes in its surface, facing the element formation substrate, a moisture absorbent layer, which is formed of resin containing a mixture constituted of one or a plurality of kinds of a chemical moisture absorbent selected from, for example, calcium oxide, barium oxide, and strontium oxide or a physical moisture absorbent selected from, for example, synthetic zeolite and silica gel.

The organic EL element is arranged in a planar form so as to follow the element formation substrate or divided and arranged in a plurality of planar forms. Further, it is preferable that a protective film constituted of an organic or inorganic layer is formed on the uppermost portion of the organic EL element which is in contact with the grease layer or the gel layer.

In the above case, the protective film is preferably constituted of silicon oxide and silicon nitride selected from SiO, $SiO_2$, SiON, and $Si_3N_4$, an organic substance forming an element such as α-NPD (Bis[N-(1-naphthyl)-N-phenyl]benzidine) or Alq[Tris(8-hydroxyquinolinato)aluminum(III)], or a mixture of the organic substance and an inorganic substance. The protective film is formed by a laminated film of one or a plurality of these components.

In a preferred embodiment, the grease layer or the gel layer is formed to be larger than the outer periphery of a light-emitting part of the organic EL element facing the grease layer or the gel layer. Further, the moisture absorbent layer is formed to be larger than the outer periphery of a light-emitting part of the organic EL element facing the moisture absorbent layer.

Meanwhile, a first preferred method for manufacturing the organic EL light-emitting device according to this invention includes a process of coating a grease or a gel agent onto one side of a sealing substrate, a process of applying an adhesive, used for the formation of a sealing portion, along the outer peripheral edge of the surface of the sealing substrate onto which the grease or the gel agent is coated, a process of making a surface of an element formation substrate, on which an organic EL element, previously including an organic light-emitting layer, is stacked, face the surface of the sealing substrate onto which the grease or the gel agent is coated, a process of discharging a gas in a space between the sealing substrate and the element formation substrate, which are in a state of being placed in a laminating device to face each other, a process of, in the state that the gas in the space between the sealing substrate and the element formation substrate is discharged, making the sealing substrate and the element formation substrate approach to each other to adhere the surface, onto which the grease or the gel agent is coated, onto the side of the organic EL element, and a process of, in the adhesive state, hardening an adhesive used for the formation of the sealing portion.

A second preferred method for manufacturing the organic EL light-emitting device according to this invention includes a process of coating a grease or a gel agent onto one side of a sealing substrate, a process of applying glass paste, used for the formation of a sealing portion, along the outer peripheral edge of the surface of the sealing substrate onto which the grease or the gel agent is coated, a process of making a surface of an element formation substrate, on which an organic EL element, previously including an organic light-emitting layer, is stacked, face the surface of the sealing substrate onto which the grease or the gel agent is coated, a process of discharging a gas in a space between the sealing substrate and the element formation substrate, which are in a state of being placed in a laminating device to face each other, a process of, in the state that the gas in the space between the sealing substrate and the element formation substrate is discharged, making the sealing substrate and the element formation substrate approach to each other to adhere the surface, onto which the grease or the gel agent is coated, onto the side of the organic EL element, and a thermal fusion bonding process of, in the adhesive state, heating and hardening the glass paste, used for the formation of the sealing portion, with laser radiation to thereby form the sealing portion.

In the above method, before the process of coating the grease or the gel agent onto one side of the sealing substrate, there may be executed a process of forming a moisture absorbent layer, which is formed of resin previously containing a moisture absorbent, on the one side of the sealing substrate to coat the grease or the gel agent onto the surface with the moisture absorbent layer.

According to the organic EL light-emitting device having the above constitution, a sealing portion formed of an adhesive is formed in the peripheral edge portion between an element formation substrate and a sealing substrate, and a grease layer or a gel layer is accommodated in between the element formation substrate, on which an organic EL element surrounded by the sealing portion is formed, and the sealing substrate so as to adhere to the element formation substrate and the sealing substrate. The grease layer or the gel layer contains an oligomer or a polymer having organosiloxane (—$R_1R_2SiO$—) or fluorinated polyether (—$CF_2CFYO$—) as a skeleton.

According to the grease layer or the gel layer containing the oligomer or the polymer having organosiloxane or fluorinated polyether as a skeleton, the thermal conductivity can be increased compared with the constitution disclosed in the Japanese Patent Application Laid-Open Nos. 2000-357587, 2001-217071, and 2003-173868, in which a gas or a liquid is filled and sealed in between the element formation substrate, on which the organic EL element is formed, and the sealing substrate. Accordingly, the speed of heat dissipation of the organic EL light-emitting device can be increased through the grease layer or the gel layer, and, at the same time, the entire temperature can be uniformly maintained.

According to the above constitution, even in the organic EL light-emitting device having a relatively large light-emitting area, the operational temperature can be rendered uniform, whereby the brightness unevenness in the organic EL light-emitting panel generated due to the influence of the characteristics of the organic EL element and the influence of the heat generation of the organic EL element can be effectively prevented.

The grease layer or the gel layer serves for moistureproof of the organic EL element. The moisture absorbent is dispersed in the grease layer or the gel layer, whereby the moistureproof effect for the organic EL element can be further increased with the aid of the moisture absorbent.

Further, the element formation substrate on which the organic EL element is stacked and formed and the plate-shaped sealing substrate are sealed together at their peripheral edge portions with an adhesive or by laser fusion, whereby compared with the organic EL light-emitting device with a cap-shaped sealing substrate disclosed in the Japanese Patent Application Laid-Open Nos. 2000-357587, 2001-217071, and 2003-173868, the processing of the sealing substrate can be simplified, thereby contributing to the reduction of the manufacturing cost.

Also when the sealing substrate with a recessed cross-sectional surface in which a recess is provided in the central portion is used, the element formation substrate and the sealing substrate can be sealed together, with an adhesive or by laser fusion, at a portion between the edge portion of the flexion and the element formation substrate, thereby contributing to the reliability of sealing and the reduction of the manufacturing cost.

BRIEF DESCRIPTION OF THE DRAWINGS

FIG. 6 is a table showing a result of temperature measurement;

Figure 1:
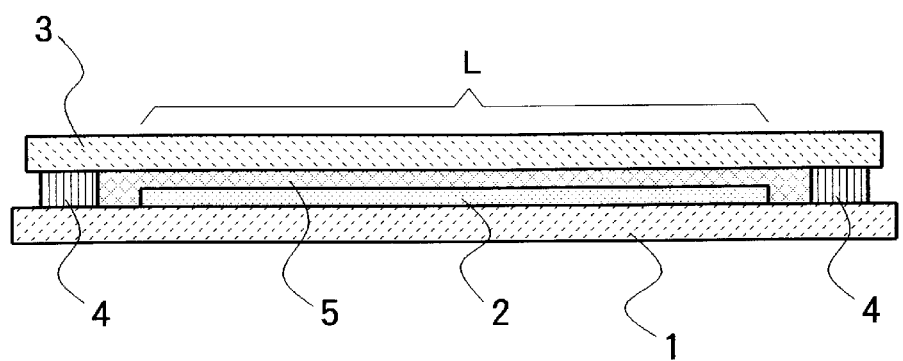
FIG. 1 is a centrally broken schematic view of an organic EL light-emitting device of a first embodiment according to this invention.

EXPLANATION OF REFERENCE NUMERALS AND LETTERS 1 element formation substrate
2 organic EL element
2A transparent electrode
2B organic light-emitting layer
2C opposed electrode
2D protective film
3 sealing substrate
4 sealing portion (adhesive)
5 grease layer, gel layer (grease agent, gel agent)
6 moisture absorbent layer
7a, 7b laminating devices
8, 9 auxiliary plate
E1 DC power supply
L light-emitting part

DESCRIPTION OF THE PREFERRED EMBODIMENT

Hereinafter, an organic EL light-emitting device according to this invention will be described based on embodiments shown in the drawings. FIG. 1 is a schematic view (cross-sectional view) of an example of a basic structure of the organic EL light-emitting device according to this invention. An element formation substrate 1 is formed of a transparent material such as glass and formed into, for example, a rectangular shape. The element formation substrate 1 has on its one side (the upper surface shown in FIG. 1) an organic EL element 2 stacked thereon.

A plate-shaped sealing substrate 3, formed into a rectangular shape like the element formation substrate 1, is disposed so as to face the surface of the element formation substrate 1, on which the organic EL element 2 is stacked. The element formation substrate 1 and the sealing substrate 3 are sealed at the peripheral edge portion of the four sides with a sealing portion 4 through an adhesive. A space is provided between the element formation substrate 1 with the organic EL element 2 surrounded by the sealing portion 4 and the plate-shaped sealing substrate 3, and a grease layer 5 or a gel layer 5, which is in a semi-solid state at a normal temperature, is accommodated in the space so as to tightly adhere to the element formation substrate 1 and the plate-shaped sealing substrate 3.

Namely, in the embodiment shown in FIG. 1, the grease layer 5 or the gel layer 5 is accommodated so as to substantially fill in the space formed between the element formation substrate 1 and the sealing substrate 3, whereby the grease layer 5 or the gel layer 5 is formed to have a larger size than the outer periphery of a light-emitting part L (a portion of an organic light-emitting layer 2B sandwiched between a transparent electrode 2A and an opposed electrode 2C, which are described later) of the organic EL element 2 facing the grease layer 5 or the gel layer 5.

Figure 2:
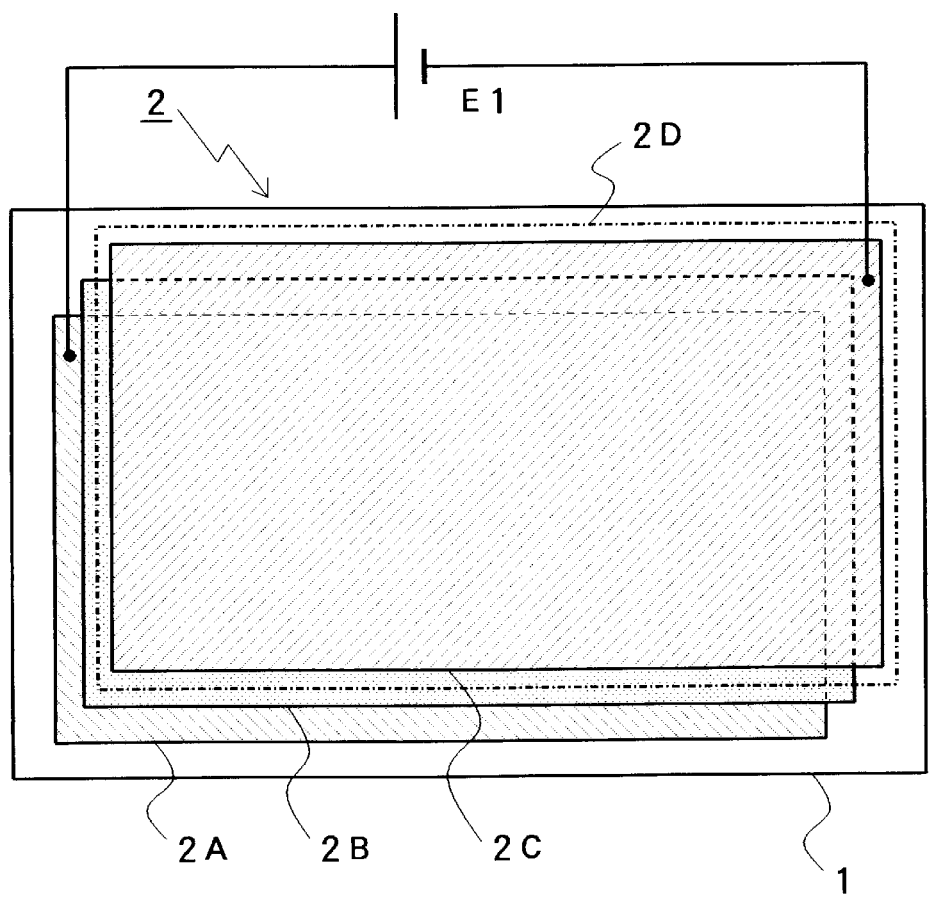
FIG. 2 is a plan view explaining an example of a laminated structure of the organic EL element in the organic EL light-emitting device shown in FIG. 1.

FIG. 2 shows an example of the basic structure of the organic EL element 2 formed on the element formation substrate 1. In FIG. 2, each layer constituting the organic EL element 2 is separated in a layer direction. Namely, this type of the organic EL element 2 has on one side of the element formation substrate 1 the transparent electrode 2A formed in a predetermined pattern. The transparent electrode 2A is a first electrode and formed of, for example, ITO.

An organic light-emitting layer 2B is formed so as to be superimposed on the transparent electrode 2A. The organic light-emitting layer 2B is constituted of, for example, a hole transportation layer, a light-emitting layer, and an electron transportation layer; however, in FIG. 2, the organic light-emitting layer 2B is shown as one layer. The opposed electrode 2C, which is a second electrode and formed of, for example, aluminum is formed so as to be superimposed on the organic light-emitting layer 2B.

The organic EL element 2 constituted of the transparent electrode 2A, the organic light-emitting layer 2B, and the opposed electrode 2C, as needed, further includes a protective film 2D, which is constituted of an organic or inorganic layer and is film-formed so as to cover the entire light-emitting part L sandwiched between at least the transparent electrode 2A and the opposed electrode 2C of the organic El element 2. According to this constitution, the organic EL element 2 is constituted so as to be in contact with the grease layer or the gel layer through the protective film 2D.

A DC power supply E1 is connected between the transparent electrode 2A and the opposed electrode 2C, whereby the portion (the light-emitting part L) of the organic light-emitting layer 2B sandwiched between the transparent electrode 2A and the opposed electrode 2C emits light, and the light transmits through the transparent electrode 2A and the element formation substrate 1 to be derived outside.

As in the organic EL light-emitting panel disclosed in the Japanese Patent Application Laid-Open Nos. 2000-357587, 2001-217071, and 2003-173868, when an inert gas such as nitrogen or an inert liquid such as fluorine oil is sealed in the organic EL light-emitting panel, as described in the paragraphs [0007] to [0009], due to the above described reason, there occurs such a brightness gradient (brightness unevenness) that the central portion of the surface light-emitting source is dark, and the portion near the power-feeding part provided around the central portion is bright.

Thus, in the embodiment shown in FIGS. 1 and 2, the grease layer 5 or the gel layer 5 is accommodated in between the element formation substrate 1 with the organic EL element 2 film-formed thereon and the sealing substrate 3 facing the element formation substrate 1 in a state of tightly adhering to the element formation substrate 1 and the sealing substrate 3. The grease layer 5 or the gel layer 5 has good heat conduction properties to thereby effectively prevent the occurrence of the brightness unevenness even in the organic EL light-emitting device having a relatively large area.

It is preferable that the grease layer 5 or the gel layer 5 contains an oligomer or a polymer containing organosiloxane ($-R_1R_2SiO-$: $R_1$ and $R_2$ represent a saturated or unsaturated alkyl group, a substituted or unsubstituted phenyl group, or a saturated or unsaturated fluoroalkyl group.) or fluorinated polyether ($-CF_2CFYO-$: Y represents F or $CF_3$.) in the skeleton, and further contains as an additive a moisture absorbent or a heat-transfer agent, or the moisture absorbent and the heat-transfer agent.

As the oligomer or polymer having organosiloxane bond ($-R_2SiO-$) as a skeleton, an oligomer or a polymer having a dimethylsiloxane bond ($-(CH_3)_2SiO-$) as a skeleton can be preferably used. Specifically, SE1880 from Dow Corning Toray Co., Ltd. or KE1057 from Shin-Etsu Chemical Co., Ltd. can be used.

As the organosiloxane, an oligomer or a polymer containing —$(R_1R_1SiO)_l$—$(R_1R_2SiO)_m$—$(R_1R_3SiO)_n$—($R_1$ represents a methyl group, $R_2$ represents a vinyl group or a phenyl group, $R_3$ represents a fluoroalkyl group of —$CH_2CH_2CF_3$, and l, m, and n represent integer numbers, and one or two of three figures may be 0.) in the skeleton can be used.

As the fluorinated polyether, an oligomer or a polymer, which contains —$CF_2CFYO$— (Y represents F or $CF_3$) in the skeleton and has a functional group containing Si at the terminal can be used. For example, SIFEL8470, 8370 from Shin-Etsu Chemical Co., Ltd., can be used.

It is preferable that the moisture absorbent is contained in the grease layer 5 or the gel layer 5 in a state of being dispersed therein. The moisture absorbent catching water by chemisorption or physisorption can be used. A preferred example of the moisture absorbent performing chemisorption includes a fine powder such as calcium oxide, barium oxide, and strontium oxide. A preferred example of the moisture absorbent performing physisorption includes synthetic zeolite and silica gel.

The heat-transfer agent contained in the grease layer 5 or the gel layer 5 is a metal oxide selected from, for example, silicon oxide, aluminum oxide, calcium oxide, barium oxide, and strontium oxide, a fine powder of nitride selected from silicon nitride and aluminum nitride, or a mixture of one or a plurality of kinds of synthetic zeolite and silica gel. The heat-transfer agent is preferably dispersed in the grease layer 5 or the gel layer 5 when used.

The additive is contained in the grease layer 5 or the gel layer 5 in a weight ratio of 10 to 80%. The thickness of the grease layer 5 or the gel layer 5 containing the additive is preferably set in a range of 10 to 100 μm.

When the additive is contained in a weight ratio of less than 10%, the moisture absorption effect and the heat-transfer effect are reduced. Meanwhile, when the weight ratio is more than 80%, a shape retention property is too high, whereby there arises a problem that desired coating cannot be obtained.

Although the thickness of the grease layer or the gel layer containing the additive is determined to be 10 to 100 μm, this is because if the thickness is less than 10 μm, damage is applied to the element when applying pressure to the sealing substrate and the element formation substrate, and it has been found that a failure, such as a short between electrodes and a dark area, is increased at a rate of 30% or more.

As found in the experiments by the inventor of the present application, when the thickness is more than 100 μm, the thickness of the peripheral adhered portion becomes 100 μm or more, the amount of water diffusing from the adhered portion into the panel is increased, whereby there arises a problem that the rate of enlargement of the dark area is increased in the moisture resistance test at 60° C./90%.

As described above, the moisture absorbent is dispersed in the grease layer 5 or the gel layer 5, whereby a phenomenon of deterioration of the element, such as the occurrence and enlargement of the dark spot in the organic EL element, can be effectively reduced. Further, the heat-transfer agent is contained in the grease layer 5 or the gel layer 5, whereby the unique heat-transfer properties of the grease layer 5 or the gel layer 5 and the other properties can be promoted, and contributing to more effective prevention of the occurrence of the brightness unevenness in the organic EL light-emitting device.

The protective film 2D is in contact with the grease layer 5 or the gel layer 5 and formed on the uppermost portion of the organic EL element 2. The protective film 2D preferably constituted of silicon oxide and silicon nitride, such as SiO, $SiO_2$, SiON, and $Si_3N_4$, or an organic substance formed of a material used as the hole transportation layer, the electron transportation layer, and the light-emitting layer of the organic EL element, and a barrier layer and a charge generating layer of a carrier, such as α-NPD (Bis[N-(1-naphthyl)-N-phenyl]benzidine) or Alq[Tris(8-hydroxyquinolinato)aluminum(III)]. The protective film 2D is constituted of a laminated film of one or a plurality of kinds of the above components.

Figure 3A:
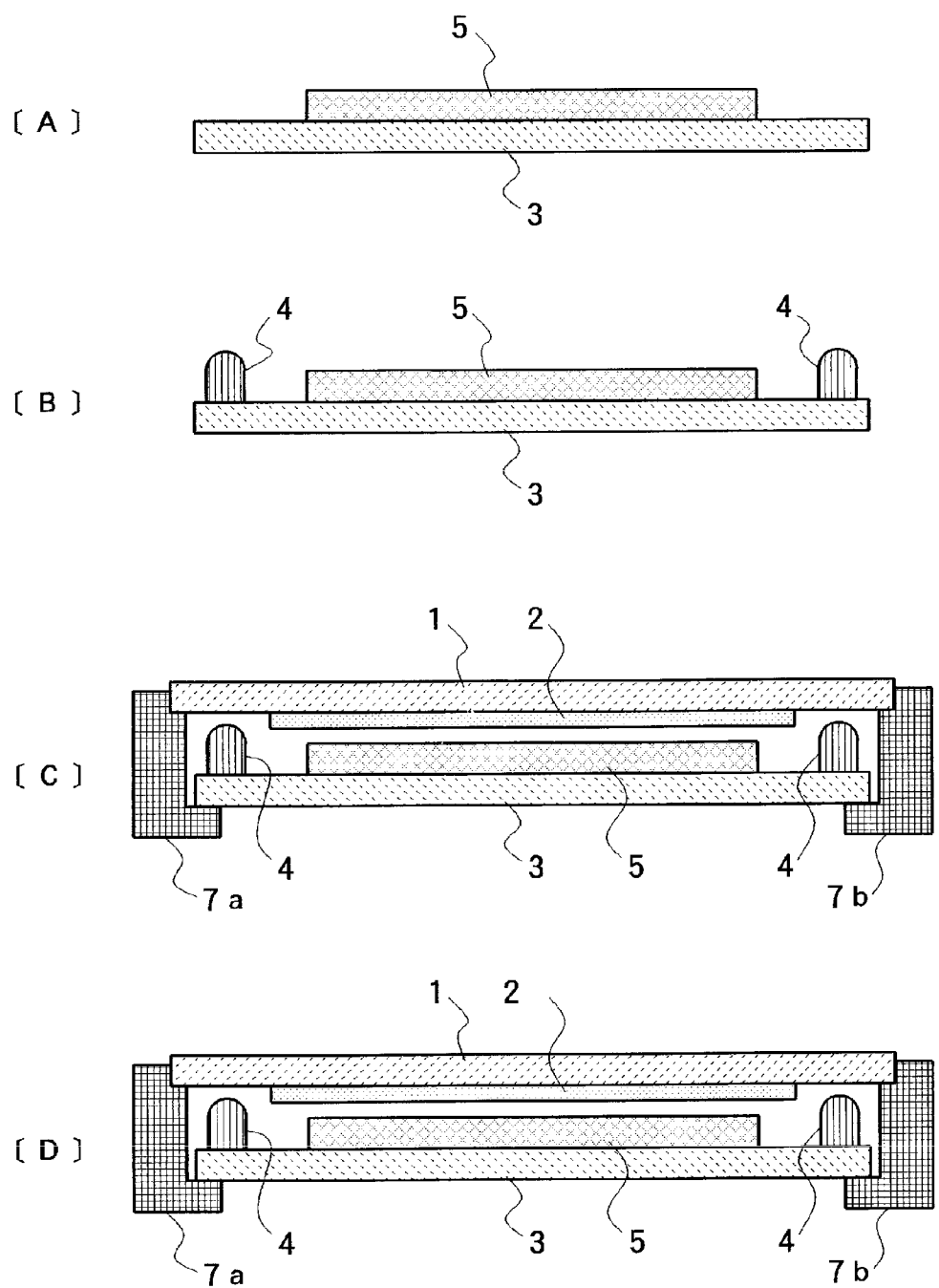
FIG. 3A(A)-FIG. 3A(D) are schematic views explaining the former half process in a case where the organic EL light-emitting device shown in FIG. 1 is manufactured.
Figure 3B:
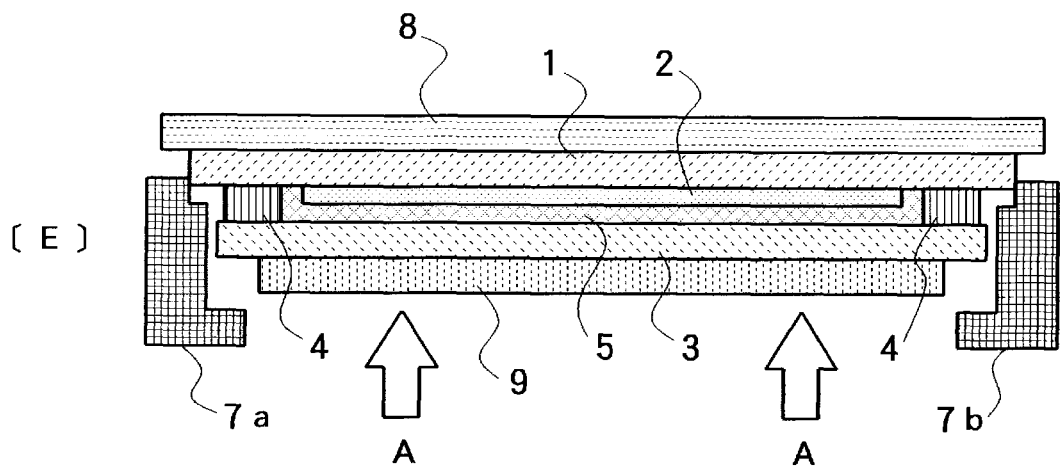
FIG. 3B(E)-FIG. 3B(G) are schematic views explaining the latter half process in the case where the organic EL light-emitting device shown in FIG. 1 is manufactured.
Figure 3B:
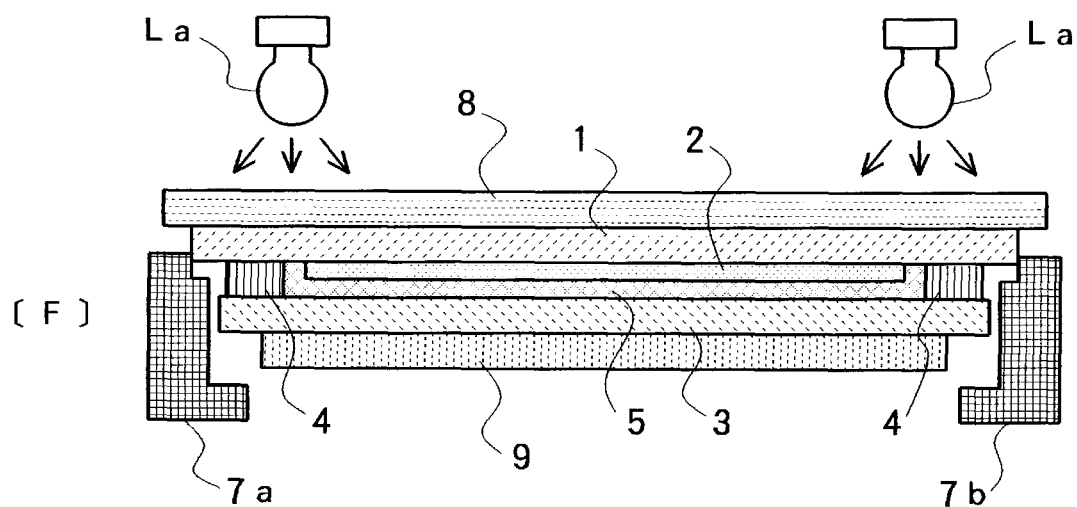
Figure 3B:
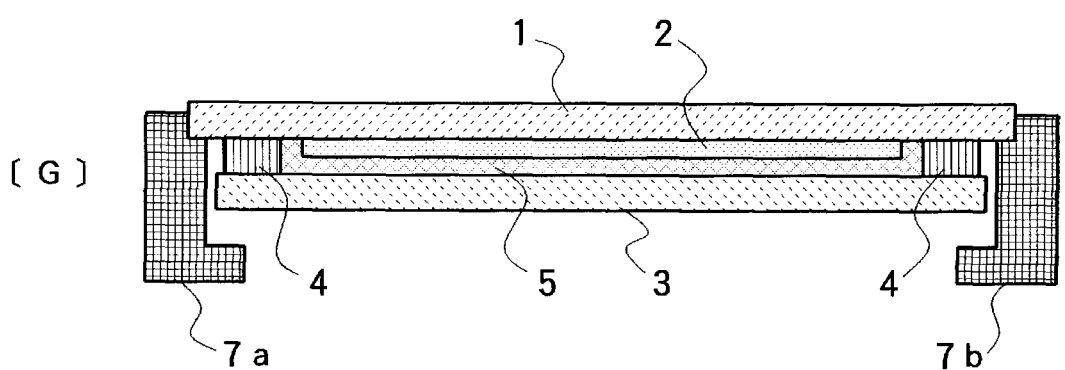

FIGS. 3A and 3B describe, in order, a preferred manufacturing process of manufacturing the organic EL light-emitting device having the above constitution. The manufacturing process to be hereinafter described is executed under an inert gas atmosphere such as nitrogen. First, as shown in a process (A) of FIG. 3A, a grease or a gel agent (assigned the same reference numeral as the grease layer 5 or the gel layer 5) is coated onto one side of the plate-shaped sealing substrate 3. The grease 5 or the gel agent 5 contains the oligomer or the polymer having organosiloxane bond (—$R_2SiO$—) or fluorinated polyether (—$CF_2CFYO$—) as a skeleton.

In the above case, the grease 5 or the gel agent 5 is coated to the central portion of the sealing substrate 3 by, for example, dispense or screen printing. The grease 5 or the gel agent 5 is a semi-solid material retaining its applied shape on the sealing substrate 3 and preferably has a viscosity of 3 Pa·S or more (pascal second) at normal temperature. There may be used a grease or a gel agent which is heated and hardened after coated and increases in viscosity much more.

In the process of coating the grease 5 or the gel agent 5, in addition to the coating of the material, the gel agent 5 formed into a sheet may be attached (placed) on one side of the sealing substrate 3.

Subsequently, as shown in a process (B) of FIG. 3A, an adhesive (assigned the same reference numeral as the sealing portion 4) for the formation of the sealing portion 4 is applied along the outer peripheral edge of the surface of the sealing substrate 3 onto which the grease 5 or the gel agent 5 is coated. A UV curable resin can be preferably used as the adhesive 4.

As shown in a process (C) of FIG. 3A, the surface of the element formation substrate 1, on which the organic EL element 2 previously including an organic light-emitting layer is stacked, faces the surface of the sealing substrate 3 to which the grease or the gel agent 5 is coated. In the process, the element formation substrate 1 and the sealing substrate 3 are set in schematically illustrated laminating devices 7a and 7b so as to face each other.

When the element formation substrate 1 and the sealing substrate 3 are placed in the laminating devices 7a and 7b to face each other, as shown in a process (D) of FIG. 3A, a gas in the space between the sealing substrate 3 and the element formation substrate 1 is discharged.

Thereafter, as shown in a process (E) of FIG. 3B, the sealing substrate 3 and the element formation substrate 1 are approached to each other, and the surface coated with the grease 5 or the gel agent 5 is adhered onto the side of the organic EL element 2. Namely, the sealing substrate 3 is brought into contact with the element formation substrate 1 to discharge the gas and reduce the pressure, and, thus, to flow the grease 5 or the gel agent 5, whereby the grease 5 or the gel agent 5 adheres onto the side of the organic EL element 2 formed on the element formation substrate 1.

In the above case, as shown in the process (E) of FIG. 3B, an auxiliary plate 8 with a mask, which is formed of, for example, quartz glass, is provided on the upper surface of the element formation substrate 1 for the purpose of determining a pressing position. Meanwhile, an auxiliary plate 9 formed of, for example, a metal plate is provided on the lower surface of the sealing substrate 3 for pressing purposes.

As shown by an arrow A in FIG. 3B, the sealing substrate 3 is then pressed upward through the auxiliary plate 9 disposed on the lower surface of the sealing substrate 3. According to this constitution, the adhesive 4 applied along the outer peripheral edge of the sealing substrate 3 is in contact with the side of the element formation substrate 1 facing the sealing substrate 3. The surface coated with the grease 5 or the gel agent 5 is adhered onto the side of the organic EL element 2, and, at the same time, the grease 5 or the gel agent 5 is pressed and spread into the entire area of the space surrounded by the adhesive 4.

Namely, as shown in the process (A) of FIG. 3A, the grease 5 or the gel agent 5 is coated, in a suitable area, onto the central portion of one side of the sealing substrate 3, whereby the grease layer 5 or the gel layer 5 is formed so as to be larger than the outer peripheral portion of the organic EL element 2 facing the grease layer 5 or the gel layer 5.

Subsequently, as shown in a process (F) of FIG. 3B, the adhesive 4, which forms the sealing portion between the four sides of the element formation substrate 1 and the opposed four sides of the sealing substrate 3, is hardened. In this process, a UV projection lamp La is disposed above the auxiliary plate 8 formed of quartz glass, and the UV light is projected on the adhesive 4 through the auxiliary plate 8 with the mask and the element formation substrate 1, whereby the adhesive 4 can be hardened. The mask formed on the auxiliary plate 8 is operated to prevent the UV light from the UV projection lamp from being projected on the organic EL element to thereby prevent the organic EL element from being damaged.

Incidentally, an inorganic frit agent such as glass paste is used instead of the adhesive 4, and it is fused by heating with laser radiation, whereby thermal fusion bonding means for forming the sealing portion can be used. After the process (F) of FIG. 3B, as shown in a process (G) of FIG. 3B, the auxiliary plates 8 and 9 are removed, and the pressure is returned to atmospheric pressure. Thereafter, the molded product is demolded from the laminating devices 7a and 7b, whereby the organic EL light-emitting device can be obtained.

Figures 4, 5:
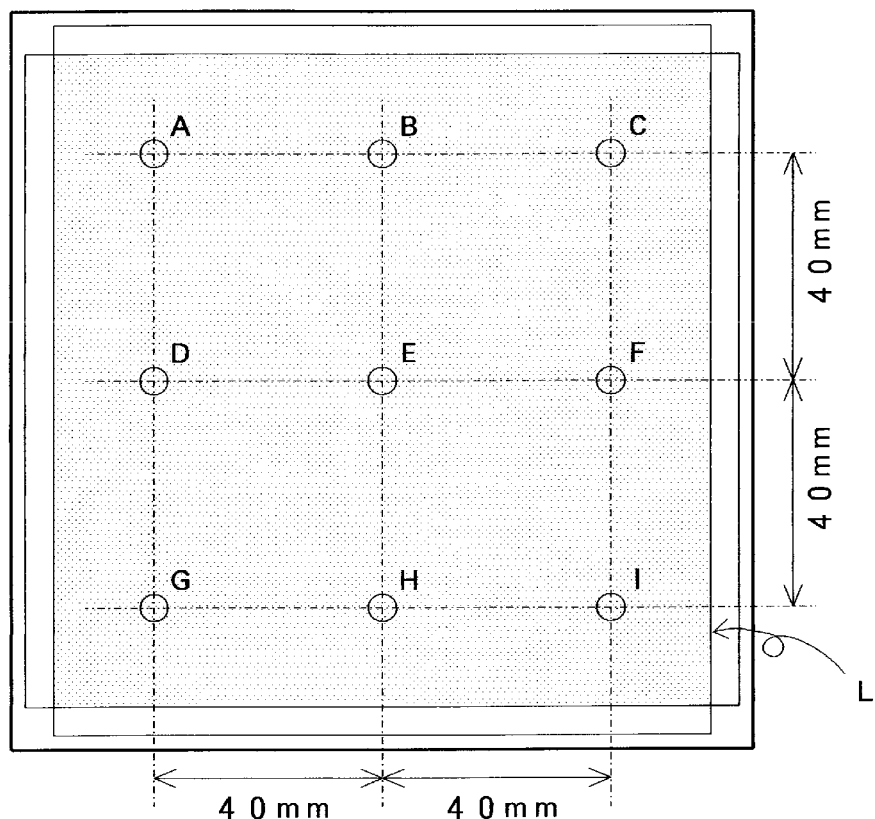
FIG. 4 is a schematic view showing an embodiment of a prototype produced for measurement.
FIG. 5 is an explanatory view showing an example of a laminated structure of the prototype of the organic EL element.

For the organic EL light-emitting device obtained by the above manufacturing process, a result of the measurement of the surface temperature when the organic EL light-emitting device is driven to emit light is shown in FIGS. 4 to 8. FIG. 4 shows an embodiment of a prototype produced for measurement. In this example, for the organic EL light-emitting device with the light-emitting part L formed into a square with one side of 115 mm, each temperature of nine points A to I of the front side (the element formation substrate 1 side) of the organic EL light-emitting device is measured.

FIG. 5 shows an example of a laminated structure of the prototype of the organic EL element 2. The names of layers and the functional materials constituting these layers are shown in FIG. 5. In the example shown in FIG. 5, the organic EL element 2 has a multiphoton structure with two light-emitting layers.

FIG. 6 shows a measured temperature (° C.) at the points A to I, shown in FIG. 4, for a comparison in which nitrogen is filled in the space between the element formation substrate 1 and the sealing substrate 3, a comparison in which a liquid is filled therein, and the case according to this invention in which a gel or a grease is filled therein. The measured values are the temperature at a time point after a lapse of 30 minutes from the application of current. In any prototype for the measurement, an aluminum soaking plate with a plate thickness of 0.5 mm, to which a heat dissipating agent such as alumina is applied, is attached to the outside of the sealing substrate 3 side through a heat-transfer member. As the soaking plate, other metals such as a copper plate can be used.

As the liquid as the filler shown in the comparative example, a methylphenyl silicone oil (SH550) from Dow Corning Toray Co., Ltd. reduced in pressure and heated at 100° C. is used. In the organic EL light-emitting device according to this invention, for example, KE1057 from Shin-Etsu Chemical Co., Ltd. of 50 wt % as a silicone gel, calcium oxide of 30 wt % as a moisture absorbent, aluminum oxide of 20 wt % as a heat-transfer material are used in the gel layer.

Figure 7:
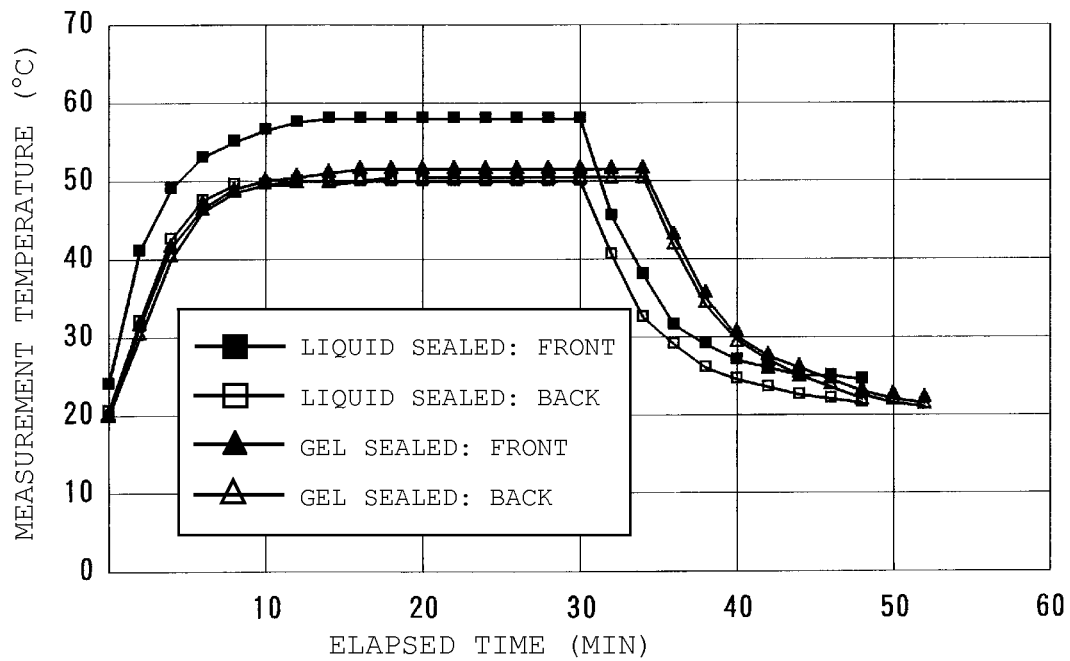
FIG. 7 is a diagram showing a measurement result of a surface temperature when applying current to the light-emitting device.
Figure 8:
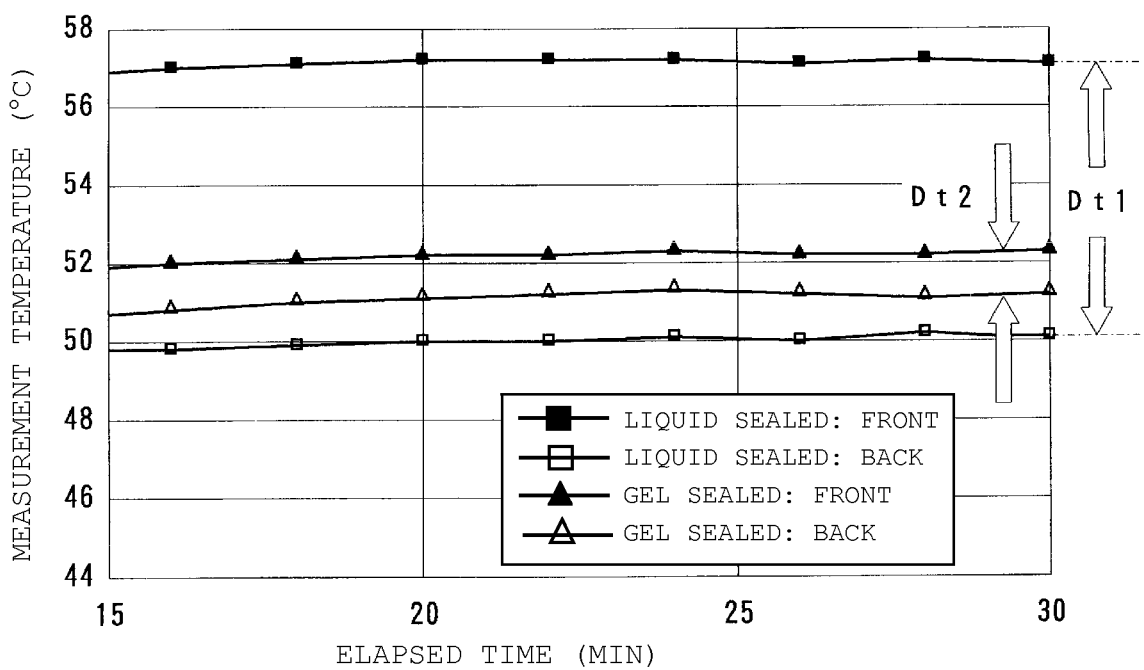
FIG. 8 is a diagram showing an enlarged scale of a part of FIG. 7.

FIG. 7 shows, in the comparative example in which the liquid is the filler and the organic EL light-emitting device of this invention in which the gel is the filler, the temperature (° C.) of the front and back sides of the device at the point E shown in FIG. 4 from the application of current to a lapse of 30 minutes and the subsequent elapse of time after the power off. FIG. 8 is an enlarged scale of FIG. 7 and shows the measurement result from the application of current to a lapse of 15 to 30 minutes.

In FIGS. 7 and 8, the measurement result in the organic EL light-emitting device of this invention is expressed as "gel sealed: front (a light extraction side)" and "gel sealed: back (sealing side)". Meanwhile, the compared measurement result in the prior art example is expressed as "liquid sealed: front (a light extraction side)" and "liquid sealed: back (sealing side)".

As shown in FIG. 6, according to the organic EL light-emitting device of this invention using the gel as the filler, it can be understood that the average value of the temperatures at points A to I is significantly reduced compared with the light-emitting device using the liquid as the filler. Further, it can be understood that the difference between the maximum value and the minimum value of the points A to I (Max−Min) is extremely small.

As shown in FIG. 8, according to the measurement result in the light-emitting device using the liquid as the filler, the temperature difference between the front and back sides at the time point after a lapse of 30 minutes from the application of current is about 7.0° C., as represented as Dt1. Meanwhile, the temperature difference between the front and back sides of the organic EL light-emitting device of this invention at the same time point can be suppressed to about 1.3° C., as represented as Dt2.

As described above, according to the organic EL light-emitting device of this invention, it can be understood, also based on the measurement result, the operational effect described in the effect of the invention can be exercised.

Figure 9:
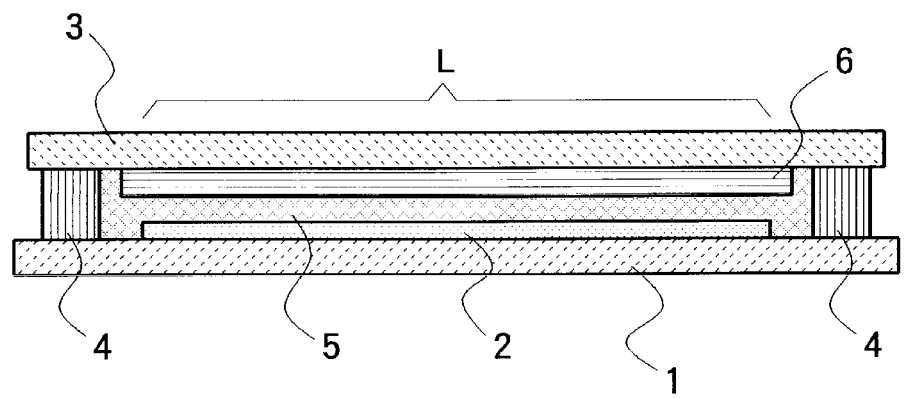
FIG. 9 is a centrally broken schematic view of an organic EL light-emitting device of a second embodiment according to this invention.

FIG. 9 schematically shows another embodiment according to the organic EL light-emitting device of this invention. In FIG. 9, components equivalent to those in FIG. 1 are assigned the same reference numerals and detailed explanations thereof are omitted. In the embodiment shown in FIG. 9, a moisture absorbent layer 6 which is formed of a resin containing a moisture absorbent is further disposed on the surface of the sealing substrate 3 facing the element formation substrate 1.

The moisture absorbent layer 6 contains the moisture absorbent dispersed in the resin constituting the moisture absorbent layer 6, and catches water by the moisture absorbent to thereby effectively prevent the dark spot from being generated and spread in the organic EL element 2. In this case, as an example of the resin constituting the moisture absorbent layer 6, a thermosetting or UV-curable epoxy or acrylic resin can be used, and the moisture absorbent is dispersed in the resin, whereby the moisture absorbent layer 6 is formed.

The moisture absorbent dispersed in the resin can catch water by chemisorption or physisorption. Specifically, there can be used a similar one to the moisture absorbent contained in the grease layer 5 or the gel layer 5 in a state of being dispersed in the grease layer 5 or the gel layer 5. As shown in FIG. 9, the moisture absorbent layer 6 is formed so as to be larger than the outer peripheral portion of the light-emitting part L of the organic EL element 2 facing the moisture absorbent layer 6, whereby a satisfactory moisture absorption effect can be exercised. An organometallic complex liquid moisture absorbent as the moisture absorbent layer 6 may be applied to be dried or hardened. For example, Ole Dry from Futaba Corporation can be used.

In the embodiment shown in FIG. 9, the moisture absorbent layer 6 is disposed so as to be attached to the sealing substrate 3, whereby the grease layer 5 or the gel layer 5 free from the moisture absorbent can be used in the organic EL light-emitting device. In addition, the grease layer 5 or the gel layer 5 containing the dispersed moisture absorbent can be used with the moisture absorbent layer 6. When the grease layer 5 or the gel layer 5 containing the dispersed moisture absorbent and the moisture absorbent layer 6 are provided in the organic EL light-emitting device, the dark spot can be further suppressed.

In addition, the grease layer 5 or the gel layer 5 containing the heat-transfer agent dispersed therein and the moisture absorbent layer 6 are provided in the organic EL light-emitting device, whereby the unique heat-transfer properties of the grease layer 5 or the gel layer 5 and the unique heat-transfer properties of the moisture absorbent layer 6 act to contribute to more effective prevention of the occurrence of the brightness unevenness in the organic EL light-emitting device.

Figure 10:
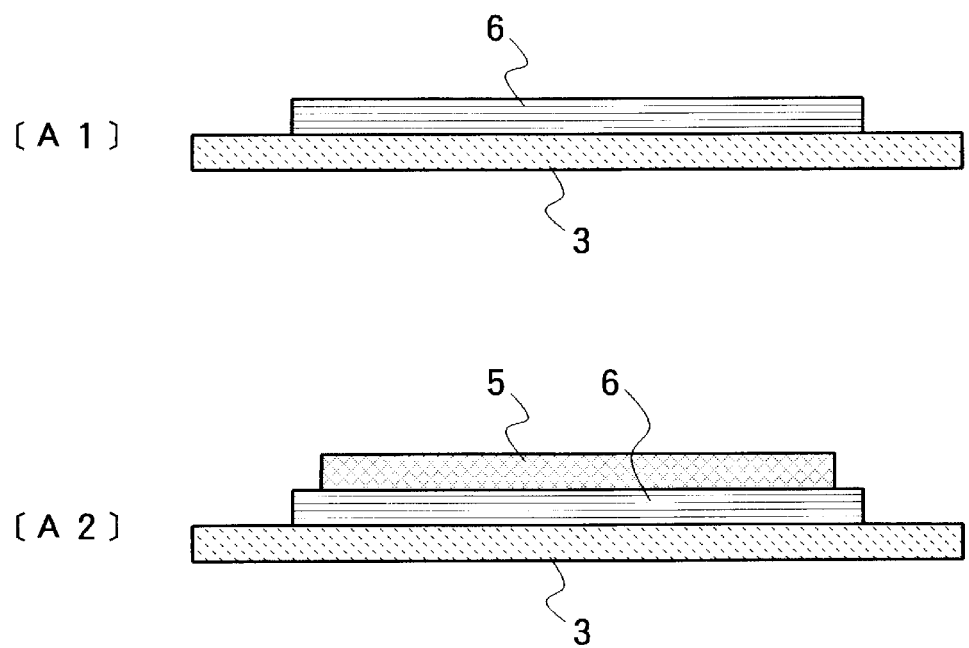
FIG. 10(A1) and FIG. 10(A2) are schematic views explaining a process at an initial stage in a case where the organic EL light-emitting device shown in FIG. 9 is manufactured.

FIG. 10 explains the manufacturing process of the organic EL light-emitting device having the constitution shown in FIG. 9. The manufacturing process of FIG. 10 is executed by separating the process (A) of FIG. 3A into two processes. Namely, in a process (A1) of FIG. 10, the moisture absorbent layer 6 is formed on one side of the plate-shaped sealing substrate 3. The grease 5 or the gel agent 5 is then coated onto the surface with the moisture absorbent layer 6 so as to be superimposed on the moisture absorbent layer 6.

Subsequently, the processes following the process (B) of FIG. 3A are executed, whereby the organic EL light-emitting device with the moisture absorbent layer 6 shown in FIG. 9 can be manufactured. Also in the organic EL light-emitting device having the constitution shown in FIG. 9, the operational effect described in the effect of the invention can be exercised.

Figure 11:
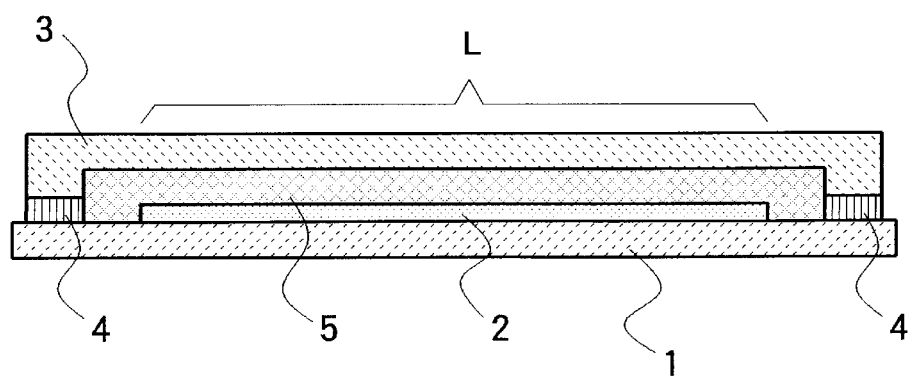
FIG. 11 is a centrally broken schematic view of an organic EL light-emitting device of a third embodiment according to this invention.
Figure 12:
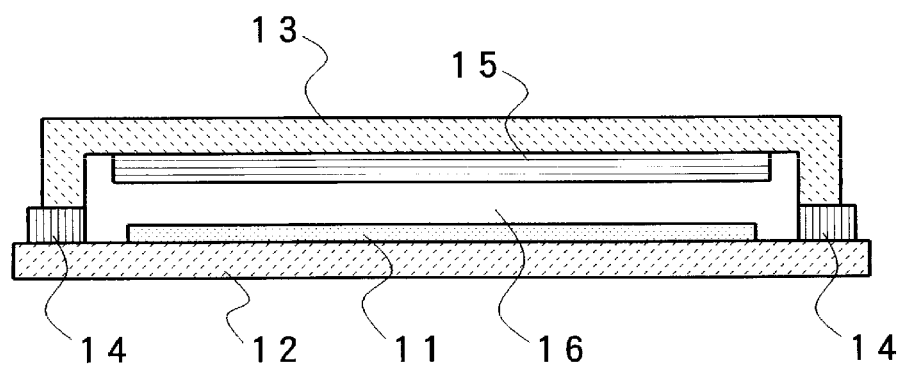
FIG. 12 is a centrally broken schematic view of an example of the prior art organic EL light-emitting device.

In the above embodiment, the plate-shaped sealing substrate 3 is used; however, instead of this, a sealing substrate having a recessed cross-sectional surface in which a recess is provided in the central portion so that the peripheral edge portion is in contact with the element formation substrate, that is, the sealing substrate 3 shown in FIG. 11 can be used. In FIG. 11, components serving the same function as those in FIG. 1 are assigned the same reference numerals. In this case, it is preferable that the grease 5 or the gel agent 5 is tightly filled in the recess. The sealing substrate and the element formation substrate with the organic EL element may be formed of a flexible resin material.

Further, in the above embodiment, each of a pair of the transparent electrode 2A and the opposed electrode 2C constituting the organic EL element 2 is formed in a planar shape (as a solid electrode) so as to follow the surface of the element formation substrate 1. However, the transparent electrode 2A is formed in a stripe shape, and the opposed electrode 2C is formed in a stripe shape so as to be perpendicular to the transparent electrode 2A, whereby the organic EL element is divided at the intersection between these electrodes, and thus the organic EL element with a plurality of light-emitting parts can be obtained.

This invention can be applied to an organic light-emitting device in which a plurality of the light-emitting parts of the organic EL element are arranged, as described above, and a similar operational effect can be obtained. In this case, even in an organic light-emitting device with a plurality of series-connected organic EL elements (surface series structure), a similar operational effect can be obtained.

The invention claimed is:

1. An organic EL light-emitting device comprising:
   an element formation substrate on which an organic EL element including an organic light-emitting layer is formed; and
   a sealing substrate for sealing the organic EL element so as to accommodate the organic EL element between the sealing substrate and the element formation substrate,
   wherein an adhesive sealing portion is formed in the peripheral edge portion between the element formation substrate and the sealing substrate, and gel layer is accommodated in between the element formation substrate, on which the organic EL element surrounded by the sealing portion is formed, and the sealing substrate in such a state of adhering to the element formation substrate and the sealing substrate, and
   wherein the gel layer contains
   an oligomer or a polymer consisting of organosiloxane, representable by formula —$R_1R_2SiO$—, wherein $R^1$ and $R^2$ each independently represents a group selected from the group consisting of an alkyl group, an alkyl group with saturated substituent, an alkyl group with unsaturated substituent, a substituted phenyl group, an unsubstituted phenyl group, a fluoroalkyl group, a fluoroalkyl group with saturated substituent and a fluoroalkyl group with unsaturated substituent as a skeleton, or
   an oligomer or a polymer consisting of fluorinated polyether, representable by formula —$CF_2CFYO$— wherein Y represents F or $CF_3$ as a skeleton and having a functional group containing Si at the terminal.

2. The organic EL light-emitting device as claimed in claim 1, wherein the sealing substrate has a plate shape or has a recessed cross-sectional surface, in which a recess is provided in the central portion so that the peripheral edge portion is in contact with the element formation substrate side, and the adhesive sealing portion in the peripheral edge portion is sealed with an adhesive or by thermal fusion.

3. The organic EL light-emitting device as claimed in claim 1, wherein the gel layer contains an oligomer or a polymer containing, as the organosiloxane, —$(R_1R_1SiO)_l$—$(R_1R_2SiO)_m$—$(R_1R_3SiO)_n$— ($R_1$ represents a methyl group, $R_2$ represents a vinyl group or a phenyl group, $R_3$ represents a fluoroalkyl group of —$CH_2CH_2CF_3$, and l, m, and n represent integer numbers, and one or two of three figures may be 0) in the skeleton.

4. The organic EL light-emitting device as claimed in claim 1, wherein the sealing substrate further comprises in its surface, facing the element formation substrate, a moisture absorbent layer, which is formed of resin containing a mixture comprising one or a plurality of kinds of a chemical moisture absorbent selected from calcium oxide, barium oxide, and strontium oxide or a physical moisture absorbent selected from synthetic zeolite and silica gel.

5. The organic EL light-emitting device as claimed in claim 1, wherein a protective film comprising an organic or inorganic layer is formed on the uppermost portion of the organic EL element which is in contact with the gel layer.

6. The organic EL light-emitting device as claimed in claim 1, wherein the gel layer is formed to be larger than the outer periphery of a light-emitting part of the organic EL element facing the gel layer.

7. The organic EL light-emitting device as claimed in claim 1, wherein the gel layer contains, as an additive, a moisture absorbent or a heat-transfer agent, or the moisture absorbent and the heat-transfer agent.

8. The organic EL light-emitting device as claimed in claim 7, wherein a mixture, which is used as the moisture absorbent and comprises one or a plurality of kinds of a chemical moisture absorbent or a physical moisture absorbent, is dispersed in the gel layer.

9. The organic EL light-emitting device as claimed in claim 7, wherein a mixture which is used as the heat-transfer agent and comprises one or a plurality of kinds of a metal oxide, a nitride, or synthetic zeolite and silica gel is dispersed in the gel layer.

10. The organic EL light-emitting device as claimed in claim 7, wherein when the plate-shaped sealing substrate is used, the additive is contained in the gel layer in a weight ratio of 10 to 80%, and the thickness of the gel layer containing the additive is 10 to 100 μm.

11. The organic EL light-emitting device as claimed in claim 7, wherein when the sealing substrate with a recessed cross-sectional surface is used, the additive is contained in the gel layer in a weight ratio of 10 to 80%.

* * * * *